United States Patent
Chung et al.

(10) Patent No.: US 6,934,215 B2
(45) Date of Patent: Aug. 23, 2005

(54) SEMICONDUCTOR MEMORY DEVICE HAVING DUTY CYCLE CORRECTION CIRCUIT AND INTERPOLATION CIRCUIT INTERPOLATING CLOCK SIGNAL IN THE SEMICONDUCTOR MEMORY DEVICE

(75) Inventors: Hoe-Ju Chung, Yongin (KR); Kyu-Hyoun Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 13 days.

(21) Appl. No.: 10/656,303

(22) Filed: Sep. 4, 2003

(65) Prior Publication Data

US 2004/0062121 A1 Apr. 1, 2004

(30) Foreign Application Priority Data

Sep. 4, 2002 (KR) ................. 10-2002-0053327

(51) Int. Cl.$^7$ ................................ G11C 8/00
(52) U.S. Cl. ....................... 365/233; 365/194
(58) Field of Search ............. 365/233, 233.5, 365/191, 193, 194; 327/156, 158, 175

(56) References Cited

U.S. PATENT DOCUMENTS

| | | | |
|---|---|---|---|
| 6,535,040 B2 * | 3/2003 | Jung et al. ............ | 327/175 |
| 6,677,792 B2 * | 1/2004 | Kwak .................. | 327/158 |
| 6,737,927 B2 * | 5/2004 | Hsieh .................. | 331/74 |
| 6,765,421 B2 * | 7/2004 | Brox et al. ........... | 327/175 |
| 6,859,081 B2 * | 2/2005 | Hong et al. ........... | 327/175 |
| 2004/0041609 A1 * | 3/2004 | Lin .................... | 327/175 |

FOREIGN PATENT DOCUMENTS

| | | |
|---|---|---|
| JP | 2002-42469 | 2/2002 |
| KR | 2000-0043233 | 7/2000 |

OTHER PUBLICATIONS

English language abstract of Korean Publication No. 2000–0043233.
English language abstract of Japanese Publication No. 2002–42469.

* cited by examiner

Primary Examiner—Gene N. Auduong
(74) Attorney, Agent, or Firm—Marger Johnson & McCollom, P.C.

(57) ABSTRACT

A semiconductor memory device having a duty cycle correction circuit and an interpolating circuit interpolating a clock signal in the semiconductor memory device are disclosed. The semiconductor memory device comprises a duty cycle correction circuit, which receives an external clock, corrects the duty cycle of the external clock, and outputs the corrected duty cycle. The duty cycle correction circuit comprises a first delay locked loop that receives the external clock, inverts the external clock, synchronizes the external clock with the inverted external clock, and outputs the synchronized clock; a second delay locked loop that receives the inverted external clock, synchronizes the inverted external clock with the external clock and outputs the synchronized clock; an inverting circuit that inverts the output signal of the first delay locked loop; an interpolation circuit that interpolates the output signal of the inverting circuit with the output signal of the second delay locked loop, and outputs the interpolated signal; and a control circuit that controls the interpolation circuit in response to the clock frequency information of the external clock.

15 Claims, 6 Drawing Sheets

| CLOCK FREQUENCY(MHz) | 200 | 166 | 133 |
|---|---|---|---|
| tck(nsec) | 5 | 6 | 7.5 |
| IN A CASE OF CL=3(nsec) | 15 | 18 | 22.5 |
| IN A CASE OF CL=2.5(nsec) | 12.5 | 15 | 18.75 |
| IN A CASE OF CL=2(nsec) | 10 | 12 | 15 |

SEMICONDUCTOR MEMORY DEVICE HAVING DUTY CYCLE CORRECTION CIRCUIT AND INTERPOLATION CIRCUIT INTERPOLATING CLOCK SIGNAL IN THE SEMICONDUCTOR MEMORY DEVICE

BACKGROUND OF THE INVENTION

This application claims priority to Korean Patent Application No. 2002-53327 filed on Sep. 4, 2002, in the Korean Intellectual Property Office, the disclosure of which is incorporated herein in its entirety by reference.

1. Field of the Invention

The present invention relates to a synchronous semiconductor memory device, and more particularly, to a semiconductor memory device having a duty cycle correction circuit correcting the duty cycle of an external clock signal and an interpolation circuit interpolating the clock signal in the semiconductor memory device.

2. Description of the Related Art

The duty cycle of a clock signal is a numerical value representing the ratio of a pulse width with respect to a pulse period of the clock signal. In digital clock applications, it is very important for the duty cycle of a clock signal to be precisely controlled. In synchronous semiconductor memory devices that output data by synchronizing with a clock, when the duty cycle of a clock signal is not precisely controlled distortion of the data can occur. Thus, it is very important to precisely control the duty cycle.

In general, a clock signal with a duty cycle of 50% is mainly used in digital clock applications such as a semiconductor integrated circuit. A duty cycle of 50% means that the high-level and low-level portions of the clock signal are of identical duration. When a clock signal whose duty cycle is not at 50% is input to a duty cycle correction circuit, the duty-cycle correction circuit converts the clock signal whose duty cycle is not at 50% into a clock signal with a duty cycle of 50%.

FIG. 1 shows a duty cycle correction circuit 1000 correcting the duty cycle of an external clock. The duty cycle correction circuit 1000 shown in FIG. 1 includes a delay locked loop 110, an interpolation circuit 120, and an inverting circuit 130.

The delay locked loop 110 receives an external clock CLK_IN and an output signal of the inverting circuit 130, delays the external clock CLK_IN for a predetermined time, and outputs the delayed clock signal. The inverting circuit 130 inverts the output signal of the delay locked loop 110, and outputs the inverted output signal. The interpolation circuit 120 receives the external clock CLK_IN and the output signal CLK_B of the inverting circuit 130, interpolates these signals, and outputs a duty cycle-corrected clock signal CLK_OUT.

FIG. 2 shows internal details of the interpolation circuit 120 from FIG. 1. The interpolation circuit 120 shown in FIG. 2 includes a plurality of inverting circuits 210, 220, and 230. The first and second inverting circuits 210 and 220 are connected to a common output node N1. The output node N1 is an input to the third inverting circuit 230. The first inverting circuit 210 includes a PMOS transistor MP21 and a NMOS transistor MN22, and the second inverting circuit 220 includes a PMOS transistor MP23 and a NMOS transistor MN24. The third inverting circuit 230 receives a signal from the output node N1, and inverts the signal of the output node N1 at a predetermined point in time.

If the clock frequency of the external clock CLK_IN changes, the point in time when the third inverting circuit 230 inverts changes. FIGS. 3A and 3B show the relationships between an input signal and an output signal of an inverting circuit according to the clock frequency of an external clock. In FIG. 3A, the external clock CLK_IN has a low frequency, and in FIG. 3B, the external clock CLK_IN has a high frequency. As shown in FIG. 3A, when the external clock CLK_IN has a low frequency, the slope of the signal at the output node N1 is large. Thus, the point in time when the external clock CLK_IN is inverted changes from a to b to c, and the output signal at the output node N1 changes greatly.

As shown in FIG. 3B, when the external clock CLK_IN has a high frequency, the slope of the signal at the output node N1 is small. Thus, the point in time when the external clock CLK_IN is inverted changes from a to b to c, and the output signal at the output node N1 does not change greatly. However, when the external clock CLK_IN has a high frequency, since a drop in the speed of the clock signal is slow, the clock signal is not completely swung from a low voltage to a high voltage.

SUMMARY OF THE INVENTION

The present invention provides an interpolation circuit for interpolating a clock signal according to clock frequency information of an external clock.

The present invention also provides a duty cycle correction circuit having an interpolation circuit, and a semiconductor memory device having a duty cycle correction circuit.

According to a first aspect of the present invention, there is provided a semiconductor memory device operating in synchronization with an external clock, comprising a frequency detecting unit that receives the external clock, detects clock frequency information of the external clock, and outputs the detected clock frequency information; and a duty cycle correction circuit that corrects the duty cycle of the external clock in response to the clock frequency information.

Preferably, the duty cycle correction circuit comprises a first delay locked loop that receives the external clock, inverts the external clock, synchronizes the external clock with the inverted external clock, and outputs the synchronized clock; a second delay locked loop that receives the inverted external clock, synchronizes the inverted external clock with the external clock, and outputs the synchronized clock; and an interpolation circuit that interpolates a signal inverting the output signal of the first delay locked loop with the output signal of the second delay locked loop and outputs the interpolated signal. The interpolation circuit comprises a first inverting circuit that receives the signal inverting the output signal of the first delay locked loop, inverts the received signal, and outputs the inverted signal; a second inverting circuit that inverts the output signal of the second delay locked loop and outputs the inverted signal, the output end of the first inverting circuit and the output end of the second inverting circuit connected with each other; a third inverting circuit that receives and inverts the output signal of the first inverting circuit and the output signal of the second inverting circuit, and outputs the inverted signals; and a plurality of capacitors having predetermined capacitances, which are connected between a ground power supply and respective input ends of the first, second, and third inverting circuits. Here, the capacitances of the plurality of capacitors are controlled by the clock frequency of the external clock.

According to a second aspect of the present invention, there is provided a semiconductor memory device operating in synchronization with an external clock, comprising a duty cycle correction circuit that receives the external clock, corrects the duty cycle of the external clock, and outputs the corrected duty cycle. The duty cycle correction circuit comprises a first delay locked loop that receives the external clock, inverts the external clock, synchronizes the external clock with the inverted external clock, and outputs the synchronized clock; a second delay locked loop that receives the inverted external clock, synchronizes the inverted external clock with the external clock and outputs the synchronized clock; an inverting circuit that inverts the output signal of the first delay locked loop; an interpolation circuit that interpolates the output signal of the inverting circuit with the output signal of the second delay locked loop and outputs the interpolated signal; and a control circuit that controls the interpolation circuit in response to the clock frequency information of the external clock. Here, the interpolation circuit is controlled in response to an output signal of the control circuit.

According to a third aspect of the present invention, there is provided a semiconductor memory device operating in synchronization with an external clock, comprising a first delay locked loop that receives the external clock, inverts the external clock, synchronizes the external clock with the inverted external clock, and outputs the synchronized clock; a second delay locked loop that receives the inverted external clock, synchronizes the inverted external clock with the external clock, and outputs the synchronized clock; and an interpolation circuit that interpolates a signal inverting the output signal of the first delay locked loop with the output signal of the second delay locked loop and outputs the interpolated signal. Here, the interpolation circuit is controlled by CAS (column address strobe) latency.

Preferably, the interpolation circuit comprises a first inverting circuit that receives and inverts the signal inverting the output signal of the first delay locked loop, and outputs the inverted signal; a second inverting circuit that inverts the output signal of the second delay locked loop and outputs the inverted signal, the output end of the first inverting circuit and the output end of the second inverting circuit connected with each other; a third inverting circuit that receives the output signal of the first inverting circuit and the output signal of the second inverting circuit, inverts these signals, and outputs the inverted signals; and a plurality of capacitors having predetermined capacitances, connected between a ground power supply and respective input ends of the first, second, and third inverting circuits. Here, the capacitances of the plurality of capacitors are controlled by the CAS latency.

According to a fourth aspect of the present invention, there is provided an interpolation circuit, included in a semiconductor memory device, which interpolates two clock signals whose clock frequencies identify with each other and whose phases are different from each other. The interpolation circuit comprises a first inverting circuit that receives a first clock signal, inverts the first clock signal, and outputs the inverted first clock signal; a second inverting circuit that receives a second clock signal, inverts the second clock signal, and outputs the inverted second clock signal, the output end of the first inverting circuit and the output end of the second inverting circuit connected with each other; a third inverting circuit that receives and inverts the output of the first inverting circuit and the output of the second inverting circuit and outputs the inverted signal; and first, second, and third capacitors having predetermined capacitances, connected between a ground power supply and respective input ends of the first, second, and third inverting circuits. Here, the capacitances of the first, second, and third capacitors are controlled according to the clock frequency.

Preferably, when the clock frequency of the external clock is high, the capacitances of the first, second, and third capacitors are small, and when the clock frequency of the external clock is low, the capacitances of the first, second, and third of capacitors are large.

Preferably, the capacitances of the first, second, and third of capacitors are controlled by CAS latency of the semiconductor memory device. When the CAS latency is high, the capacitances of the first, second, and third capacitors are small, when the CAS latency is low, the capacitances of the first, second, and third of capacitors are large.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF THE INVENTION

Figure 1:
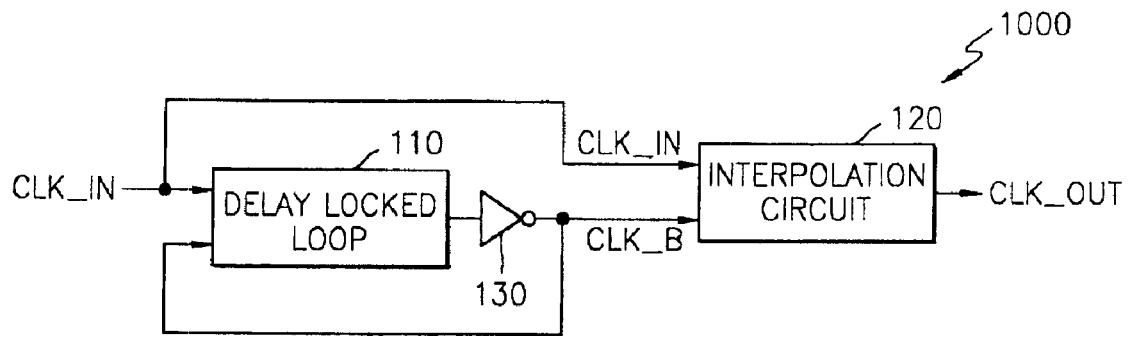
FIG. 1 contains a block diagram for a prior art duty cycle correction circuit correcting the duty cycle of an external clock.
Figure 2:
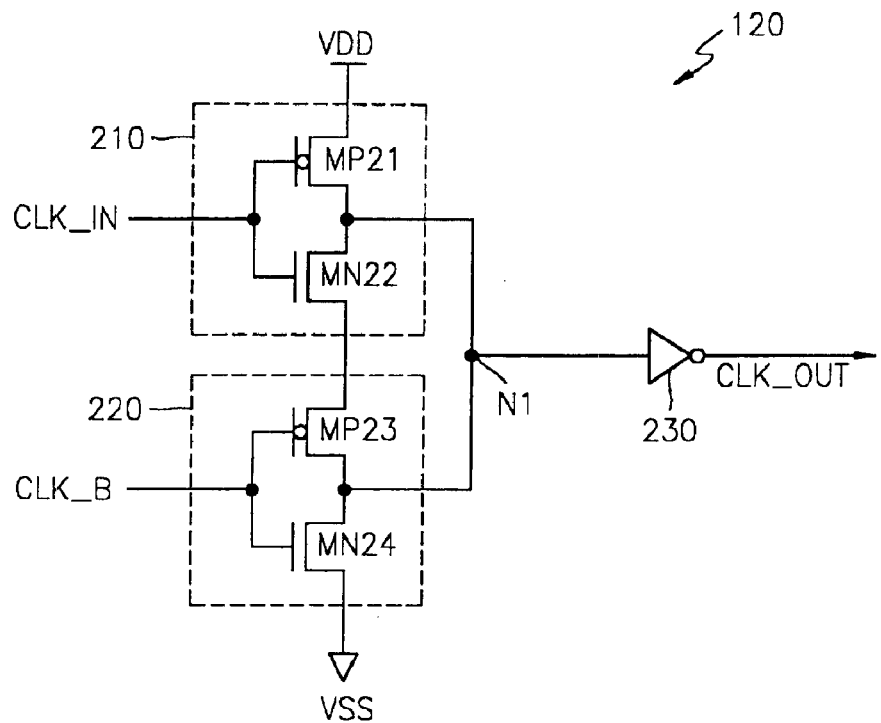
FIG. 2 illustrates an interpolation circuit useful within the circuit of FIG. 1.
Figure 3A:
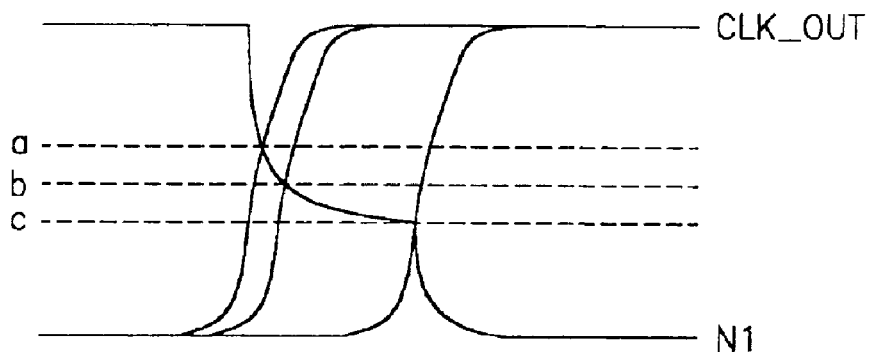
FIGS. 3A and 3B shows the relationship between an input signal and an output signal of an inverting circuit according to the external clock frequency.
Figure 3B:
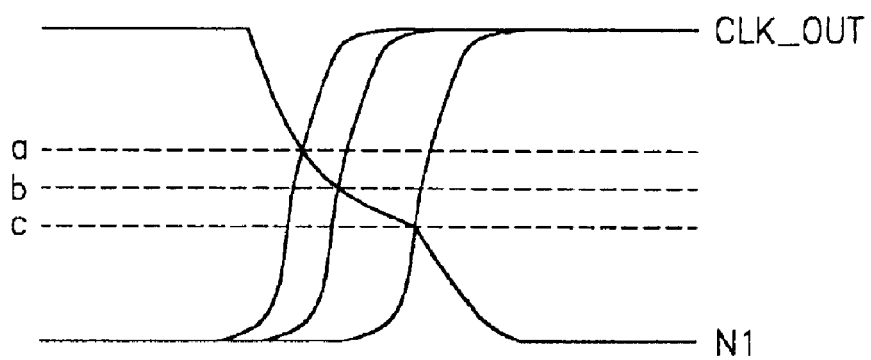

The present invention will now be described more fully with reference to the accompanying drawings, in which preferred embodiments of the invention are shown. The same reference numerals in different drawings represent the same element.

Figure 4:
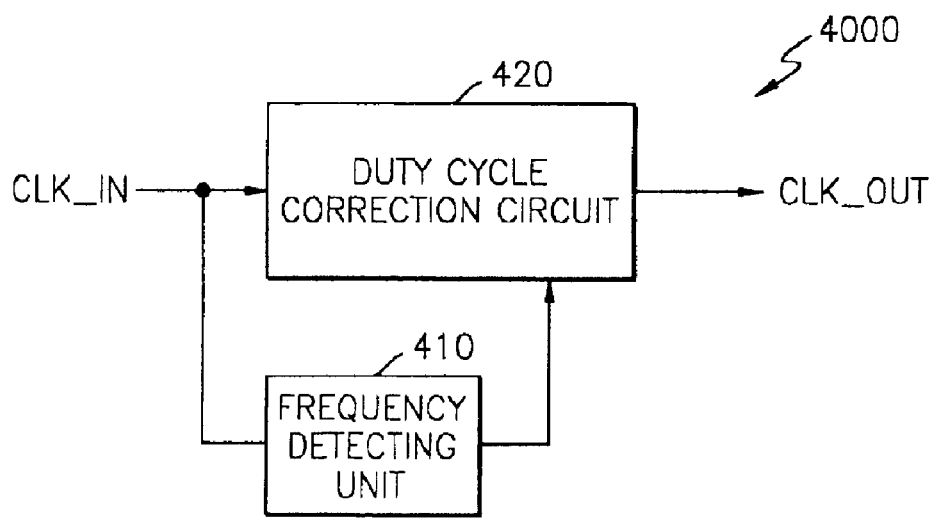
FIG. 4 is a schematic block diagram of a semiconductor memory device having a duty cycle correction circuit according to an embodiment of the present invention.

FIG. 4 is a schematic block diagram of a semiconductor memory device 4000 having a duty cycle correction circuit according to an embodiment of the present invention. The semiconductor memory device 4000 includes a frequency detecting unit 410 and a duty cycle correction circuit 420.

The frequency detecting unit 410 receives an external clock CLK_IN, detects clock frequency information of the external clock CLK_IN, and outputs the detected clock frequency information to the duty cycle correction circuit 420. The duty cycle correction circuit 420 corrects the duty cycle of the external clock CLK_IN in response to the clock frequency information and outputs a corrected clock signal CLK_OUT.

The clock frequency information of the external clock CLK_IN is detected in order to correct the duty cycle of the external clock CLK_IN. At this time, in a case where the clock frequency is high, the duty cycle is corrected corresponding to the external clock having the high frequency. In a case where the clock frequency is low, the duty cycle is corrected corresponding to the external clock having the low frequency. Thus, a semiconductor memory device 4000 in which the duty cycle is precisely corrected can be provided.

Figure 5:
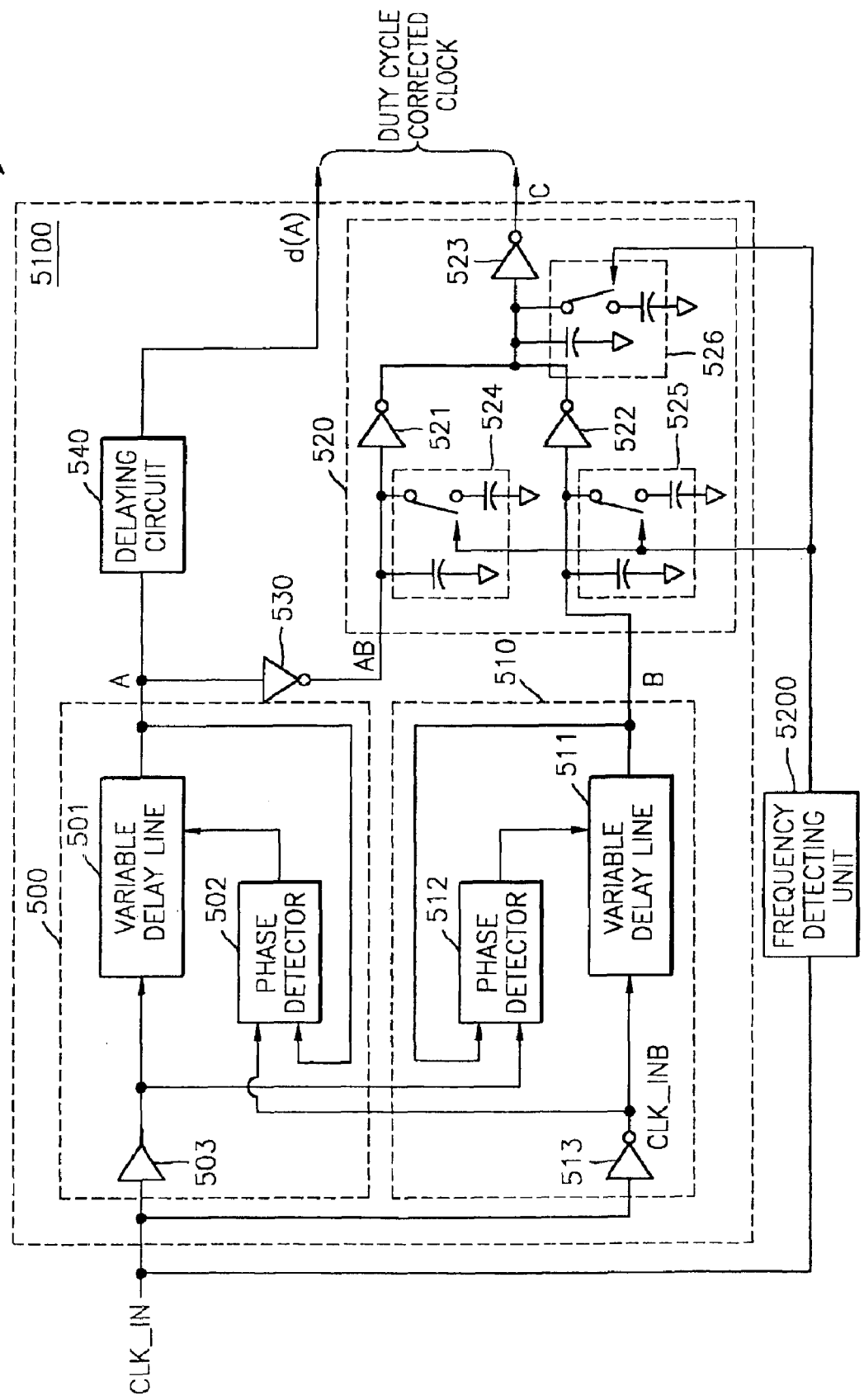
FIG. 5 shows a semiconductor memory device having a duty cycle correction circuit according to an embodiment of the present invention in detail.
Figure 6:
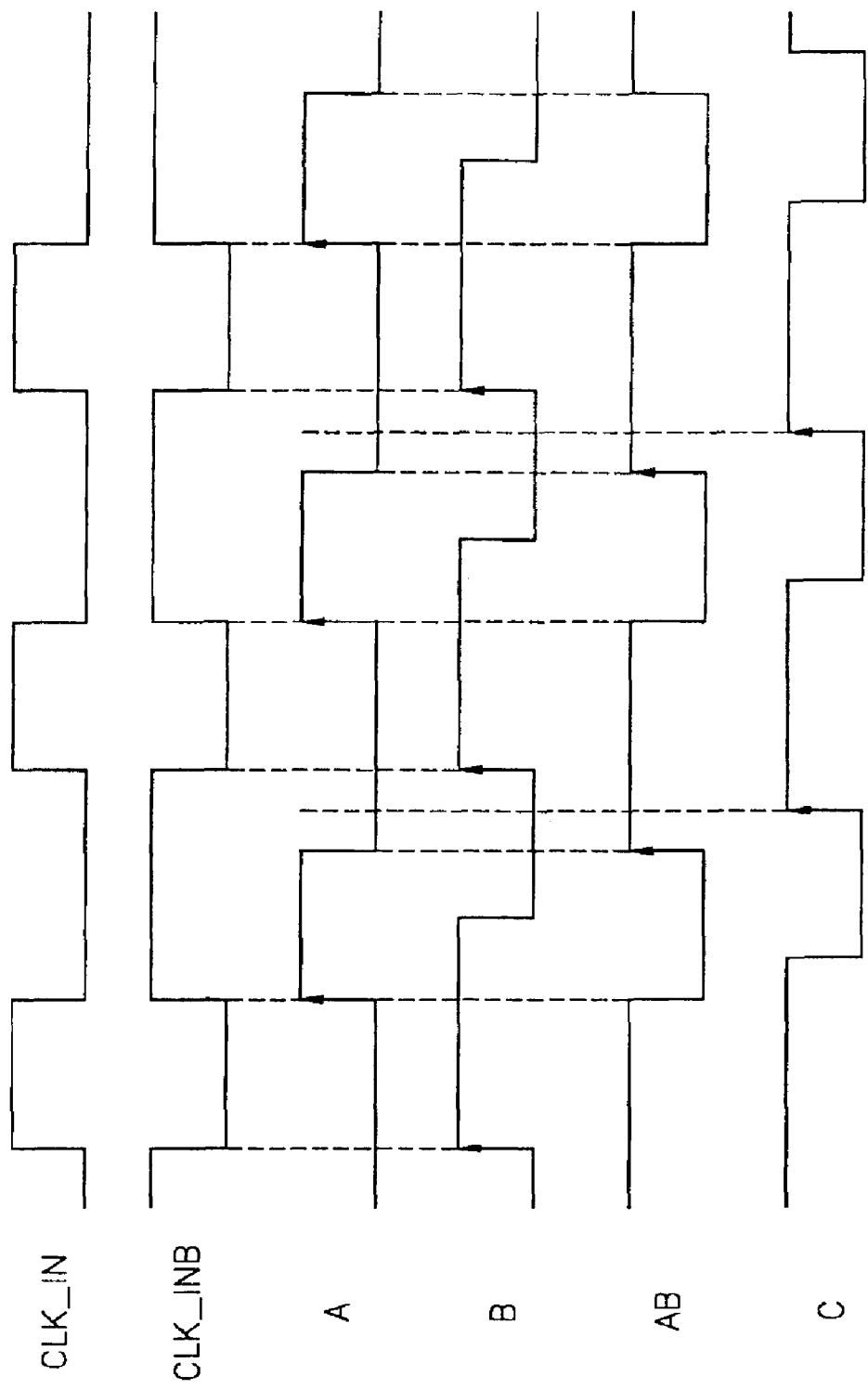
FIG. 6 is a timing diagram showing waveforms at respective locations of the duty cycle correction circuit shown in FIG. 5.

FIG. 5 shows a semiconductor memory device 5000 having a duty cycle correction circuit 5100 according to an embodiment of the present invention in detail. FIG. 6 is a timing diagram showing waveforms in respective locations of the duty cycle correction circuit 5100 shown in FIG. 5. The semiconductor memory device 5000 includes the duty cycle correction circuit 5100 and a frequency detecting unit 5200.

The duty cycle correction circuit 5100 includes a first delay locked loop 500, a second delay locked loop 510, and an interpolation circuit 520. The duty cycle correction circuit 5100 may further include a second inverter 530 for inverting an output signal of the first delay locked loop 500. Also, the duty cycle correction circuit 5100 may include a delaying circuit 540 for delaying the output signal of the first delay locked loop 500 for a predetermined time.

The first delay locked loop 500 includes a first variable delay line 501, a first phase detector 502, and an input buffer 503. The second delay locked loop 510 includes a second variable delay line 511, a second phase detector 512, and a first inverter 513 inverting an external clock CLK_IN.

The input buffer 503 receives and buffers the external clock CLK_IN and outputs the buffered clock to the first variable delay line 501 and the second phase detector 512. The first variable delay line 501 delays the output signal of the input buffer 503 for a predetermined time in response to an output signal of the first phase detector 502 and outputs a delayed output signal A. The first inverter 513 receives the external clock CLK_IN, inverts the external clock CLK_IN, and outputs an inverted external clock CLK_INB.

The first phase detector 502 outputs a signal for controlling the first variable delay line 501 in response to the inverted external clock CLK_INB and the output signal of the first variable delay line 501. The second variable delay line 511 delays the inverted external clock CLK_INB for a predetermined time in response to an output signal of the second phase detector 512 and outputs the delayed external clock CLK_INB. The second phase detector 512 outputs a signal for controlling the second variable delay line 511 in response to the output signal of the input buffer 503 and the output signal of the second variable delay line 511.

The second inverter 530 receives and inverts an output signal A of the first variable delay line 501 and outputs an inverted signal AB. The interpolation circuit 520 includes first, second and third inverting circuits 521, 522, and 523. The output end of the first inverting circuit 521 and the output end of the second inverting circuit 522 are connected with each other. The common output end of the first and second inverting circuits 521 and 522 is an input end of the third inverting circuit 523. A plurality of capacitors 524, 525, and 526 having predetermined capacitances are connected between respective input ends and respective ground power supplies of the first, second and third inverting circuits 521, 522, and 523, respectively. Capacitances of the respective capacitors 524, 525, and 526 are controlled by an output signal of the frequency detecting unit 5200.

The interpolation circuit 520 receives and interpolates the inverted signal AB and the output signal B of the second variable delay line 511 and outputs a interpolated signal C. Here, an output end of the second inverter 530 is connected to an input end of the first inverting circuit 521, and an output end of the second variable delay line 511 is connected to an input end of the second inverting circuit 522.

The delaying circuit 540 receives the output signal A of the first variable delay line 501, delays the output signal A for a predetermined time, and outputs a delayed signal d(A). The delaying circuit 540 delays the output signal of the first delay locked loop 500 by the sum of a delay amount of the interpolation circuit 520 and a delay amount of the second inverter 530, in order to synchronize the two output signals d(A) and C of the duty cycle correction circuit 5100. In a case where the delay amount of the interpolation circuit 520 is great, another delaying circuit may be added to the delaying circuit 540 to compensate for the great delay amount.

Operations of the semiconductor memory device 5000 and the interpolation circuit 520 according to the present invention now will be explained with reference to FIGS. 5 and 6. If the first delay locked loop 500 receives an external clock CLK_IN whose duty-cycle is not at 50%, the first delay locked loop 500 outputs the output signal A, and the second delay locked loop 510 receives the inverted external clock CLK_INB and outputs the output signal B.

Here, the first delay locked loop 500 outputs the output signal A obtained by synchronizing the external clock CLK_IN with the inverted external clock CLK_INB. The second delay locked loop 510 outputs the output signal B obtained by synchronizing the inverted external clock CLK_INB with the external clock CLK_IN.

The second inverter 530 inverts the output signal A of the first delay locked loop 500, and the interpolation circuit 520 interpolates the inverted output signal AB of the output signal A and the output signal B of the second delay locked loop 510, and outputs the output signal C. Supposing that the interpolation circuit 520 and the second inverter 530 do not have the delays, the duty cycle corrected clocks, as shown in FIG. 6, are the output signal A and the output signal C. That is, the duty cycles of the signal A has a constant value and the signal C also has another constant value.

The frequency detecting unit 5200 receives the external clock CLK_IN and detects and outputs clock frequency information of the external clock CLK_IN. The output signal of the frequency detecting unit 5200 adjusts the capacitances of the first, second, and third capacitors 524, 525, and 526 of the interpolation circuit 520.

When the external clock CLK_IN has a high frequency, the capacitances of the capacitors 524, 525, and 526 are small in order to reduce the delay of the interpolation circuit 520. When the external clock CLK_IN has a low frequency, the capacitances of capacitors 524, 525, and 526 are large in order increase the delay of the interpolation circuit 520.

As described above, the semiconductor memory device in which the duty cycle is precisely corrected can be provided by adjusting the capacitance and the delay amount of the interpolation circuit 520 in response to the clock frequency information of the external clock.

Figures 7, 8:
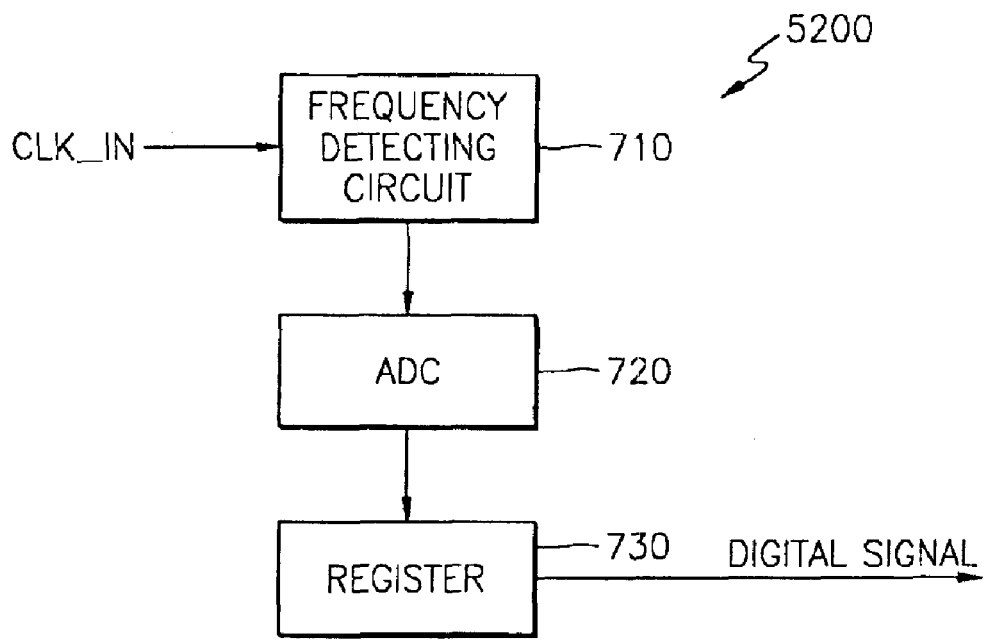
FIG. 7 shows the structure of frequency detecting unit shown in FIG. 5.
FIG. 8 is a table showing the relationship between CAS (column address strobe) latency and the clock frequency of a semiconductor memory device.

FIG. 7 shows the structure of the frequency detecting unit 5200 shown in FIG. 5. The frequency detecting unit 5200 includes a frequency detecting circuit 710, an analog-to-digital converter (ADC) 720, and a register 730.

The frequency detecting circuit 710 receives the external clock CLK_IN and detects the clock frequency of the external clock CLK_IN. The ADC 720 receives an output signal of the frequency detecting circuit 710, converts the output signal into a digital signal, and outputs the digital signal. The register 730 receives the output signal of the ADC 720 and stores the output signal of the ADC 720.

The digital signal stored in the register 730 controls the capacitances of the plurality of capacitors 524, 525, and 526 of the interpolation circuit 520 of FIG. 5 so that the interpolation circuit 520 can operate precisely.

FIG. 8 is a table showing the relationship between CAS (column address strobe) latency and the clock frequency of a semiconductor memory device. As shown in FIG. 8, if the CAS latency increases, the operation frequency of an external clock is high. The CAS latency indirectly indicates operation frequency information of the external clock. Thus, the duty cycle correction circuit and the interpolation circuit, which are controlled by the CAS latency, can be embodied without using the frequency detecting unit.

Figure 9:
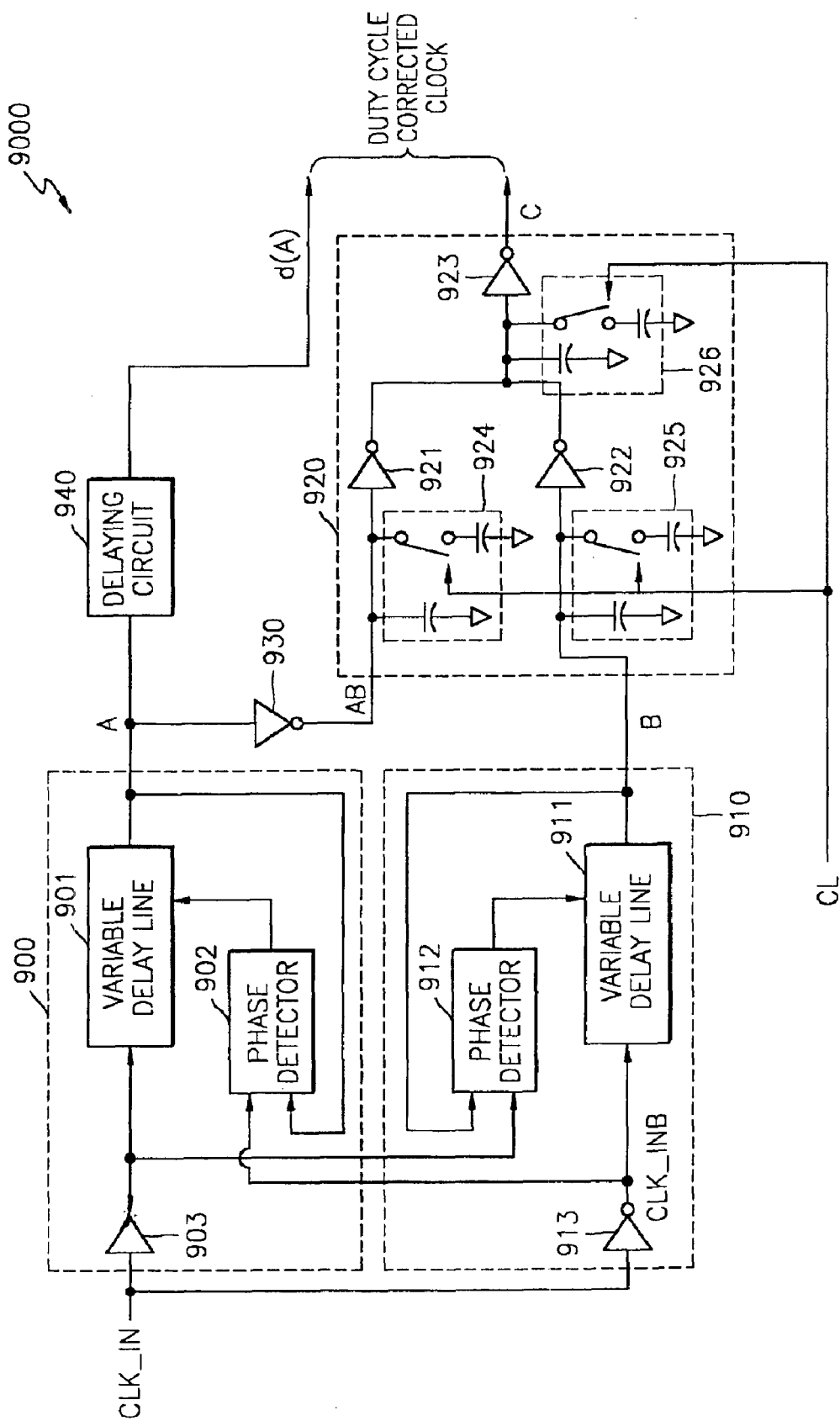
FIG. 9 shows a semiconductor memory device, which is controlled by the CAS latency and has a duty cycle correction circuit, according to an embodiment of the present invention.

FIG. 9 shows a semiconductor memory device, which is controlled by CAS latency and has a duty cycle correction circuit, according to an embodiment of the present invention. The semiconductor memory device 9000 of FIG. 9 includes a first delay locked loop 900, a second delay locked loop 910, and an interpolation circuit 920. Preferably, the semiconductor memory device 9000 further includes a second inverter 930 inverting an output signal A of the first delay locked loop 900, and a delaying circuit 940 delaying the output signal A of the first delay locked loop 900 for a predetermined time.

The first delay locked loop 900 includes a first variable delay line 901, a first phase detector 902, and an input buffer 903. The second delay locked loop 910 includes a second variable delay line 911, a second phase detector 912, and a first inverter 913 inverting an external clock CLK_IN. The first delay locked loop 900 receives the external clock CLK_IN, synchronizes the external clock CLK_IN with the inverted external clock CLK_INB, and outputs the synchronized external clock. The second delay locked loop 910 receives the inverted external clock CLK_INB, synchronizes the inverted external clock CLK_INB with the external clock CLK_IN, and outputs the synchronized external clock.

The input buffer 903 receives and buffers the external clock CLK_IN and outputs a buffered clock to the first variable delay line 901 and the second phase detector 912. The first variable delay line 901 delays the output signal of the input buffer 903 for a time in response to the output signal of the first phase detector 902 and outputs the delayed output signal of the input buffer 903. The first inverter 913 receives the external clock CLK_IN, inverts the external clock CLK_IN, and outputs an inverted external clock CLK_INB.

The first phase detector 902 outputs a signal for controlling the first variable delay line 901 in response to the inverted external clock CLK_INB and the output signal of the first variable delay line 901. The second variable delay line 911 delays the inverted external clock CLK_INB for a predetermined time in response to an output signal of the second phase detector 912 and a delayed inverted external clock at B. The second phase detector 912 outputs a signal for controlling the second variable delay line 911 in response to the output signal of the input buffer 903 and the output signal of the second variable delay line 911.

The second inverter 930 receives and inverts an output signal A of the first variable delay line 901 and outputs an inverted signal AB. The interpolation circuit 920 includes first, second, and third inverting circuits 921, 922, and 923. The output end of the first inverting circuit 921 and the output end of the second inverting circuit 922 are connected with each other. The common output end of the first and second inverting circuits 921 and 922 is an input end of the third inverting circuit 923. Capacitors 924, 925, and 926 having predetermined capacitances are connected between respective input ends of the first, second and third inverting circuits 921, 922, and 923 and a ground power supply. Capacitances of the respective capacitors 924, 925, and 926 are controlled by CAS latency of the semiconductor memory device 9000.

The delaying circuit 940 receives the output signal A of the first variable delay line 901, delays the output signal A for a predetermined time, and outputs a delayed signal d(A). The delaying circuit 940 delays the output signal of the first delay locked loop 900 by the sum of the delay amount of the interpolation circuit 920 and the delay amount of the second inverter 930, in order to synchronize the two output signals d(A) and C of a duty cycle correction circuit. In a case where the delay amount of the interpolation circuit 920 is great, another delaying circuit may be added to the delaying circuit 940 to compensate for the great delay amount.

The interpolation circuit 920 of the semiconductor memory device 9000 responds to the value of the CAS latency corresponding to the clock frequency of the external clock CLK_IN and adjusts the capacitances of the capacitors 924, 925, and 926 of the interpolation circuit 920. For a case where the CAS latency is large, the capacitances of the capacitors 924, 925, and 926 are small in order to reduce the delay amount of the interpolation circuit 920. When the CAS latency is small, the capacitances of the capacitors 924, 925, and 926 are high in order to increase the delay amount of the interpolation circuit 920.

The semiconductor memory device 9000 precisely interpolates the external clock and precisely corrects the duty cycle by adjusting the capacitance or the delay amount of the interpolation circuit 920 in response to the CAS latency.

As described above, semiconductor memory device embodiments according to the present invention can precisely correct the duty cycle according to the clock frequency of the external clock or the CAS latency of the semiconductor memory device by responding to the clock frequency information of the external clock or the CAS latency and adjusting the capacitance or the delay amount of the interpolation circuit.

Further, the interpolation circuit according to the present invention can correctly correct the clock signal according to the clock frequency of the external clock or the CAS latency of the semiconductor memory device by responding to the clock frequency information of the external clock or the CAS latency and adjusting the capacitance or the delay amount of the interpolation circuit.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A semiconductor memory device operating in synchronization with an external clock, comprising:
   a frequency-detecting unit that receives the external clock, detects clock frequency information of the external clock, and outputs the detected clock frequency information; and
   a duty cycle correction circuit that corrects the duty cycle of the external clock in response to the clock frequency information.

2. The semiconductor memory device of claim 1, wherein the duty cycle correction circuit comprises:

a first delay locked loop that receives the external clock, inverts and delays the external clock, synchronizes the delayed external clock with the inverted external clock, and outputs the delayed synchronized external clock;

a second delay locked loop that receives and delays the inverted external clock, synchronizes the delayed inverted external clack with the external clock, and outputs the delayed synchronized inverted clock; and an interpolation circuit which interpolates a signal inverting the output signal of the first delay locked loop with the output signal of the second delay locked loop, and outputs the interpolated signal.

3. The semiconductor memory device of claim 2, wherein the interpolation circuit comprises:

a first inverting circuit that receives the signal inverting the output signal of the first delay locked loop, inverts the received signal, and outputs the inverted signal;

a second inverting circuit that inverts the output signal of the second delay locked loop and outputs the inverted signal, the output end of the first inverting circuit and the output end of the second inverting circuit connected with each other;

a third inverting circuit that receives and inverts the output signal of the first inverting circuit and the output signal of the second inverting circuit, and outputs the inverted signal, and a plurality of capacitors having predetermined capacitances, connected between a ground power supply and respective input ends of the first, second, and third inverting circuits, wherein the capacitances of the plurality of capacitors are controlled by the clock frequency information.

4. The semiconductor memory device of claim 3, wherein when the clock frequency of the external clock is high, the capacitances of the plurality of capacitors are small, and when the clock frequency of the external clock is low, the capacitances of the plurality of capacitors are large.

5. The semiconductor memory device of claim 1, wherein the frequency detecting unit comprises:

a frequency detecting circuit that receives the external clock end detects the clock frequency of the external clock;

an analog-to-digital converter (ADC) that receives an output signal of the frequency detecting circuit, converts the output signal into a digital signal, and outputs the digital signal; and a register that receives the output signal of the ADC and stores the output signal of the ADC as the clock frequency information.

6. A semiconductor memory device operating in synchronization with an external clock, comprising a duty cycle correction circuit that receives the external clock, corrects the duty cycle of the external clock, and outputs the corrected duty cycle, wherein the duty cycle correction circuit comprises:

a first delay locked loop that receives the external clock, inverts and delays the external clock, synchronizes the delayed external clock with the inverted external clock, and outputs the delayed synchronized external clock;

a second delay locked loop that receives and delays the inverted external clock, synchronizes the delayed inverted external clock with the external clock, and outputs the delayed synchronized inverted clock;

an inverting circuit that inverts the output signal of the first delay locked loop;

an interpolation circuit that interpolates the output signal of the inverting circuit with the output signal of the second delay locked loop and outputs an interpolated signal; and a control circuit that controls the interpolation circuit in response to clock frequency information for the external clock.

7. The semiconductor memory device of claim 6, wherein the control circuit generates the clock frequency information by measuring the frequency of the external clock.

8. The semiconductor memory device of claim 6, wherein the control circuit bases the clock frequency information on CAS (column address strobe) latency.

9. A semiconductor memory device operating in synchronization with an external clock, comprising:

a first delay locked loop that receives the external clock, inverts and delays the external clock, synchronizes the delayed external clock with the inverted external clock, and outputs the delayed synchronized external clock;

a second delay locked loop that receives and delays the inverted external clock, synchronizes the delayed inverted external clock with the external clock, and outputs the delayed synchronized inverted clock; and an interpolation circuit that interpolates a signal inverting the output signal of the first delay locked loop with the output signal of the second delay locked loop and outputs the interpolated signal, wherein the interpolation circuit is controlled by CAS (column address strobe) latency.

10. The semiconductor memory device of claim 9, wherein the interpolation circuit comprises:

a first inverting circuit that receives and inverts the signal inverting the output signal of the first delay locked loop and outputs the inverted signal;

a second inverting circuit that inverts the output signal of the second delay locked loop and outputs the inverted signal, the output end of the first inverting circuit mid the output end of the second inverting circuit being connected with each other;

a third inverting circuit that receives the output signal of the first inverting circuit and the output signal of the second inverting circuit, inverts these signals, and outputs the inverted signals; and a plurality of capacitors having predetermined capacitances connected between a ground power supply and respective input ends of the first, second, and third inverting circuits, wherein the capacitances of the plurality of capacitors are controlled by the CAS latency.

11. The semiconductor memory device of claim 10, wherein when the clock frequency of the external clock is high, the capacitances of the plurality of capacitors are small, and when the clock frequency of the external clock is low, the capacitances of the plurality of capacitors are large.

12. An interpolation circuit, included in a semiconductor memory device, that interpolates two clock signals whose clock frequencies identify with each other and whose phases are different from each other, the interpolation circuit comprising:

a first inverting circuit that receives a first clock signal having a predetermined clock frequency, inverts the first clock signal, and outputs the inverted first clock signal;

a second inverting circuit that receives a second clock signal having a predetermined clock frequency, inverts the second clock signal, and outputs the inverted second clock signal, the output end of the first inverting circuit and the output end of the second inverting circuit being connected with each other;

a third inverting circuit that receives and inverts the output of the first inverting circuit and the output of the second inverting circuit and outputs the inverted signals; and first, second, and third capacitors having predetermined capacitances, connected between a ground power supply and respective input ends of the first, second, and third inverting circuits, wherein the capacitances of the first, second, and third capacitors are controlled according to the clock frequency.

13. The interpolation circuit of claim 12, wherein when the clock frequency of the external clock is high, the capacitances of the first, second, and third capacitors are small, and when the clock frequency of the external clock is low, the capacitances of the first, second, and third of capacitors are large.

14. The interpolation circuit of claim 12, wherein the capacitances of the first, second, and third of capacitors are controlled by CAS latency of the semiconductor memory device.

15. The interpolation circuit of claim 14, wherein when the CAS latency is high, the capacitances of the first, second, and third capacitors are small, and when the CAS latency is low, the capacitances of the first, second, and third of capacitors are large.

* * * * *